United States Patent
Bronn et al.

(10) Patent No.: US 12,408,562 B2
(45) Date of Patent: Sep. 2, 2025

(54) MONOLITHIC SILICON JOSEPHSON JUNCTIONS FOR SUPERCONDUCTING QUBITS

(71) Applicant: International Business Machines Corporation, Armonk, NY (US)

(72) Inventors: Nicholas Torleiv Bronn, Long Island City, NY (US); Thorsten Muehge, Budenheim (DE); Mark Mattingley-Scott, Heidelberg (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 755 days.

(21) Appl. No.: 17/545,207

(22) Filed: Dec. 8, 2021

(65) Prior Publication Data

US 2023/0180632 A1    Jun. 8, 2023

(51) Int. Cl.
*H10N 60/12*    (2023.01)
*H10N 60/85*    (2023.01)

(52) U.S. Cl.
CPC ............. *H10N 60/12* (2023.02); *H10N 60/85* (2023.02)

(58) Field of Classification Search
CPC ..... H10N 60/12; H10N 60/85; H10N 60/0912
See application file for complete search history.

(56) References Cited

U.S. PATENT DOCUMENTS

| | | | |
|---|---|---|---|
| 4,220,959 A | 9/1980 | Kroger | |
| 4,253,230 A | 3/1981 | Davis | |
| 9,620,667 B1 * | 4/2017 | Quick | ............... H01L 21/2258 |
| 10,147,865 B1 * | 12/2018 | Tahan | ................ H10N 60/805 |
| 2020/0287119 A1 | 9/2020 | Black et al. | |
| 2021/0226114 A1 | 7/2021 | Holmes et al. | |

FOREIGN PATENT DOCUMENTS

DE    10130850 A1    4/2003

OTHER PUBLICATIONS

C. Marcenat et al. Low-temperature transition to a superconducting phase in boron-doped silicon films grown on (001)-oriented silicon wafers, Physical Review B 81, 020501(R) Published Jan. 4, 2010 (Year: 2010).*

(Continued)

*Primary Examiner* — Shih Tsun A Chou
(74) *Attorney, Agent, or Firm* — Amin, Turocy & Watson, LLP

(57) ABSTRACT

A monolithic silicon Josephson junction can be fabricated from a silicon wafer using semiconductor technologies such as gas immersion laser doping and smart cut technology. Rather than using a superconducting metal for the junction electrodes, silicon that has been highly doped with boron can serve as the superconducting material for the electrodes of the Josephson junction. A region of the silicon wafer that has not been doped serves as the tunnel barrier. Fabrication of the Josephson junction does not require a metallization process since the electrodes and tunnel barrier are formed from highly doped silicon and non-doped silicon, respectively. The single-crystal structure of the resulting Josephson junction yields low two-level system (TLS) noise.

20 Claims, 11 Drawing Sheets

(56) References Cited

OTHER PUBLICATIONS

Oliver et al., "Materials in superconducting quantum bits," MRS Bulletin, 38(10), 816-825 (2013), doi:10.1557/mrs.2013.229, 10 pages.
Shim et al., "Bottom-up superconducting and Josephson junction devices inside a group-IV semiconductor," Nat Commun 5, 4225 (2014). https://doi.org/10.1038/ncomms5225.
Sarnet et al., "Laser doping for microelectronics and microtechnology," Applied Surface Science 247 (2005) 537-544 (https://www.sciencedirect.com/science/article/abs/pii/S0169433205001522) 9 pages.
G. K. Celler, Sorin Cristoloveanu, "Frontiers of silicon-on-insulator," 2003 Journal of Applied Physics vol. 93, Issue: 9, pp. 4955-4978 DOI: 10.1063/1.1558223.
Zhao et al., "Merged-Element Transmon," DOI: 10.1103/PhysRevApplied.14.064006, arXiv:2008.07652v5 [quant-ph] 8 pages.
Hertzberg et al., "Laser-annealing Josephson junctions for yielding scaled-up superconducting quantum processors," npj Quantum Information 7, 129 (2021), DOI: 10.1038/s41534-021-00464-5, arXiv:2009.00781v4 [quant-ph] 16 pages.

* cited by examiner

MONOLITHIC SILICON JOSEPHSON JUNCTIONS FOR SUPERCONDUCTING QUBITS

BACKGROUND

The subject disclosure relates to quantum computing devices and, more specifically, to Josephson junctions and techniques for fabricating Josephson junctions used for superconducting qubits.

SUMMARY

The following presents a summary to provide a basic understanding of one or more embodiments of the invention. This summary is not intended to identify key or critical elements or delineate any scope of the particular embodiments or any scope of the claims. Its sole purpose is to present concepts in a simplified form as a prelude to the more detailed description that is presented later. In one or more embodiments described herein, systems, devices, computer-implemented methods, and/or computer program products that facilitate error mitigation for quantum computing devices are described.

According to one or more embodiments, a system can comprise a doping component that dopes a first region of a first side of a silicon wafer to yield a first superconducting region; and a smart cut component that performs a smart cut operation on the silicon wafer along a plane of a defect region, wherein the doping component further dopes a second region of a second side of the silicon wafer exposed by the smart cut operation to yield a second superconducting region separated from the first superconducting region by a non-doped region of the silicon wafer.

According to one or more other embodiments, a device can comprise a silicon wafer comprising a first doped region formed on a first side of the silicon wafer, wherein the first doped region is superconducting; a second doped region formed on a second side of the silicon wafer opposite the first side, wherein the second doped region is superconducting; and a non-doped region layered between the first doped region and the second doped region, wherein the non-doped region acts as a tunnel barrier of a Josephson junction comprising the first doped region, the second doped region, and the non-doped region.

Also, according to one or more other embodiments, a computer-implemented method can comprise doping, by a system operatively coupled to a processor, a first region of a first side of a silicon wafer to yield a first superconducting region; performing, by the system, a smart cut operation on the silicon wafer along a plane of a defect region; and doping, by the system, a second region of a second side of the silicon wafer exposed by the smart cut operation to yield a second superconducting region separated from the first superconducting region by a non-doped region of the silicon wafer.

DETAILED DESCRIPTION

Figure 1:
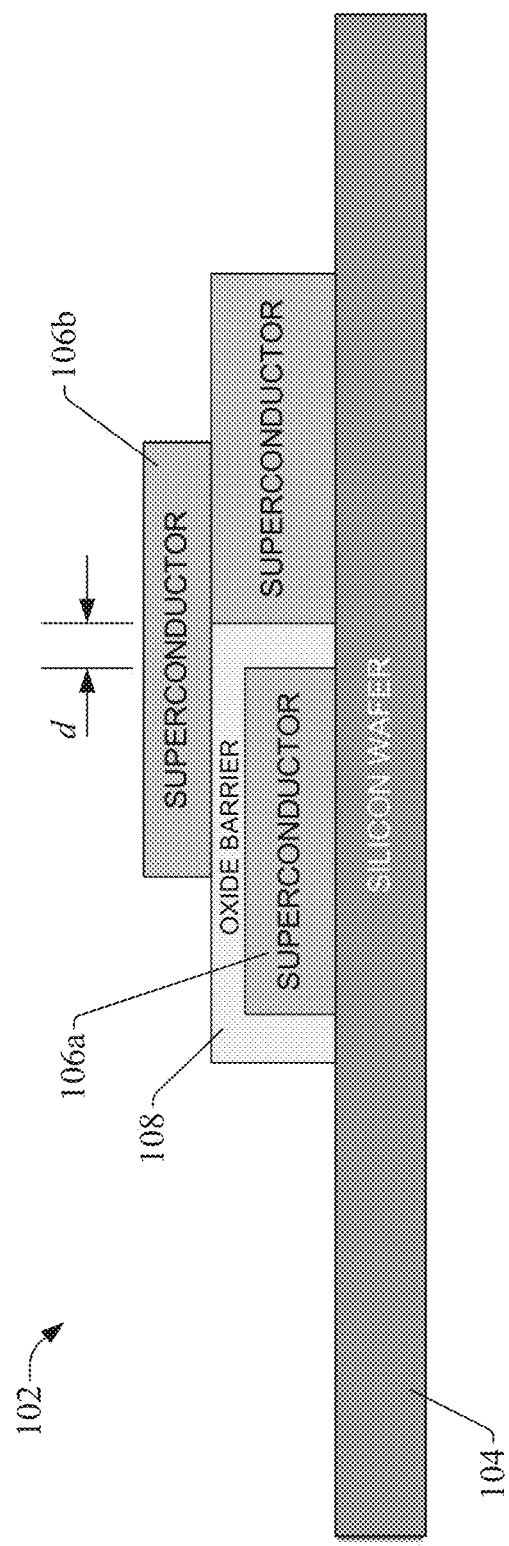
FIG. 1 is a cross-section of an example Josephson junction comprising an amorphous oxide barrier.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Classical computers operate on binary digits (or bits) that store or represent information as binary states to perform computing and information processing functions. In contrast, quantum computing devices operate on quantum bits (or qubits) that store or represent information as both the binary states and superpositions of the binary states. To that end, quantum computing devices utilize quantum-mechanical phenomena, such as entanglement and interference.

A quantum computation uses a qubit as its essential unit instead of a classical computing bit. The qubit (e.g., quantum binary digit) is the quantum-mechanical analog of the classical bit. Whereas classical bits can employ on only one of two basis states (e.g., 0 or 1), qubits can employ on superpositions of those basis states (e.g., $\alpha|0\rangle + \beta|1\rangle$, where $\alpha$ and $\beta$ are complex scalars such that $|\alpha|^2+|\beta|^2=1$), allowing a number of qubits to theoretically hold exponentially more information than a same number of classical bits. Thus, quantum computers (e.g., computers that employ qubits instead of or in addition to classical bits) can, in theory, quickly solve problems that can be extremely difficult for classical computers. Since bits of a classical computer are simply binary digits having values of either 0 or 1, almost any device with two distinct states can serve to represent a classical bit; e.g., a switch, a valve, a magnet, a coin, or other such two-state devices. Qubits, partaking of the quantum mystique, can occupy a superposition of 0 and 1 states. When the state of the qubit is measured, the result is either 0 or 1. However, in the course of a computation, a qubit can act as if it represents a mixture of the two states; e.g., 63% 0 and 37% 1.

General quantum programs coordinate quantum and classical parts of a computation. In thinking about general quantum programs, it is instructive to identify processes and abstractions involved in specifying a quantum algorithm, transforming the algorithm into executable form, running an experiment or simulation, and analyzing the results. These processes rely on intermediate representations of a computation. An intermediate representation (IR) is neither its source language description nor the target machine instructions, but something in between. Compilers may use several IRs during a process of translating and optimizing a program. The input to these compilers is source code describing a quantum algorithm and compile time parameters, and the output is a combined quantum/classical program expressed using a high-level IR. In contrast to a classical computer, a quantum computer is probabilistic, and consequently measurements of algorithmic outputs provide a proper solution within an algorithm-specific confidence interval. The computation is then repeated until a satisfactory probable certainty of solution can be achieved.

Some quantum computers realize qubits using superconducting circuits that include Josephson junctions. FIG. 1 is a cross-section of an example amorphous oxide barrier Josephson junction 102 formed on a silicon wafer 104. A Josephson junction typically comprises an insulating tunnel barrier 108 (e.g., an oxide barrier in the illustrated example) having thickness d layered between two metal superconducting layers 106a and 106b which serve as electrodes for the junction. This configuration that can yield a supercurrent that passes between the superconducting layers 106a and 106b by tunneling through the tunnel barrier 108 even in the absence of applied voltage, a phenomenon known as the Josephson effect.

Aluminum oxide is often used for the tunnel barrier 108. In some manufacturing processes this material is in an amorphous state that can yield sub-optimal electronic properties. For example, such Josephson junctions may yield various frequencies for fixed-frequency qubits due to the amorphous oxide tunnel barriers 108. Some Josephson junction implementations may also have microscopic two-level systems (TLSs) due to dangling bonds and charge traps, which can cause decoherence of the qubits.

Forming the tunnel barrier 108 using epitaxial crystal growth—whereby single crystal aluminum oxide is built on top of a superconducting metal—can yield a Josephson junction with fewer defect states and reduced TLSs relative to Josephson junctions with amorphous tunnel barriers 108. However, this approach entails a complicated manufacturing process, due in part to limited material and process selection, and is difficult to scale for multiple qubits.

To address these and other issues, one or more embodiments described herein provide a monolithic silicon (Si) Josephson junction that can be fabricated more easily than designs that use epitaxial growth technology. In one or more embodiments, rather than using a superconducting metal for the superconductor layers 106a and 106b, a highly doped semiconductor—such as silicon that has been highly doped with boron (B)—serves as the superconducting material for the electrodes of the Josephson junction. In this regard, it is noted that silicon that has been highly doped with boron becomes a superconductor at sufficiently low temperatures and can therefore be used as a substitute for the metal superconducting layers 106a and 106b (superconductivity in silicon has been observed or predicted by doping with Gallium (Ga) or aluminum (Al) as well). Silicon that has not been doped is not superconducting and has good insulating properties at low temperatures, and can therefore be used as the tunnel barrier 108 instead of aluminum oxide or another amorphous barrier.

The use of silicon for both the tunnel junction and the electrodes of the Josephson junction eliminates the need for metallization processes, such as epitaxial crystal growth, to be part of the junction fabrication process. Instead, pure semiconductor technology can be used to fabricate the junction. Embodiments described herein implement an example fabrication process designed to take advantage of the fact that silicon is used as the basis for both the tunnel junction and the electrodes. This fabrication process can combine gas immersion laser doping (GILD) with smart cut technology to fabricate precision monolithic silicon Josephson junctions. This process allows atomically process positioning of dopants, which can suppress subgap states. Moreover, the single-crystal structure of the resulting Josephson junction can also significantly reduce TLS noise.

Figure 2:
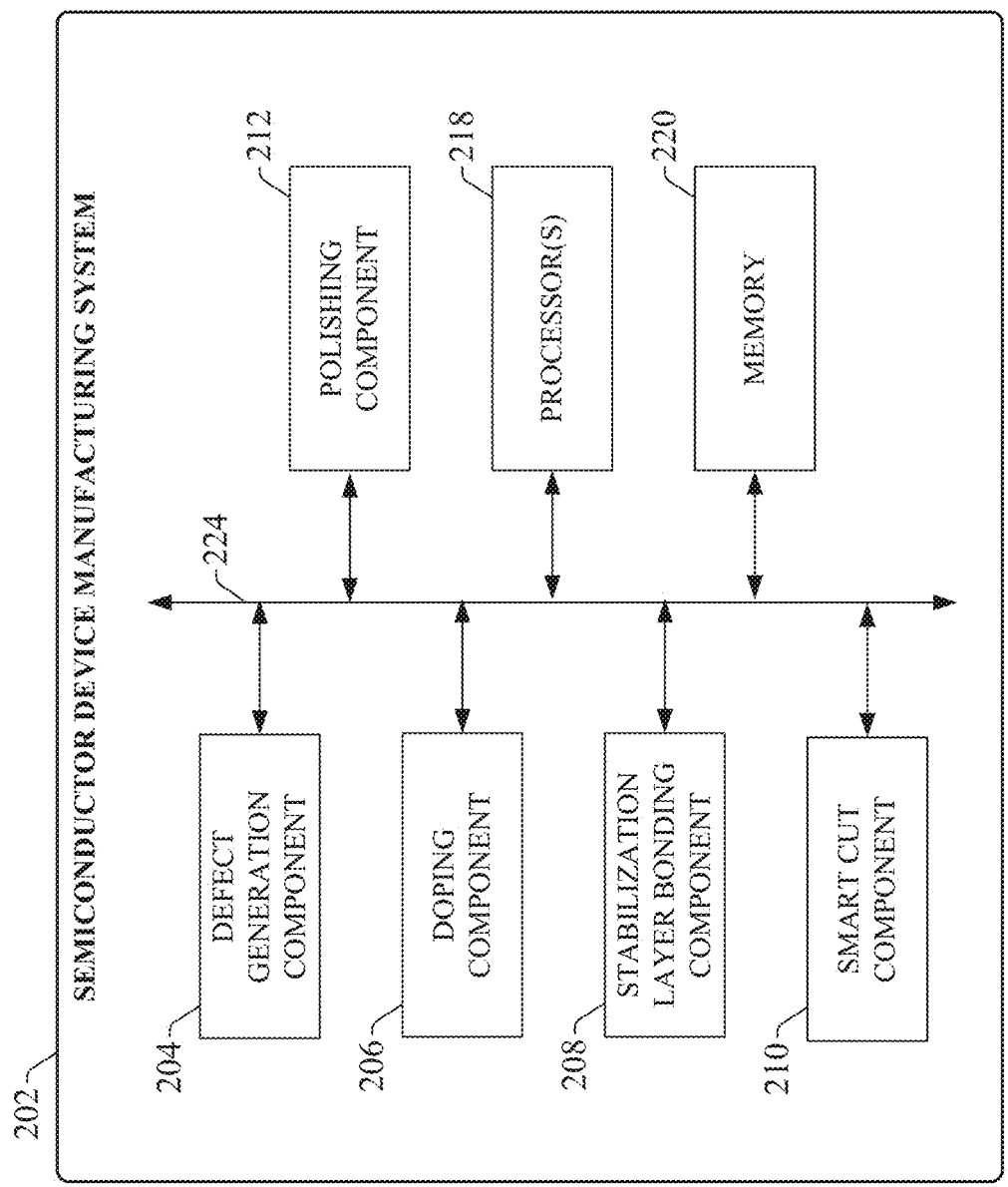
FIG. 2 illustrates a block diagram of an example, non-limiting semiconductor device manufacturing system that can fabricate a monolithic silicon Josephson junction.

FIG. 2 illustrates a block diagram of an example, non-limiting semiconductor device manufacturing system 202 that can fabricate a monolithic silicon Josephson junction. Aspects of the systems, apparatuses, or processes explained in this disclosure can constitute machine-executable components embodied within machine(s), e.g., embodied in one or more computer-readable mediums (or media) associated with one or more machines. Such components, when executed by one or more machines, e.g., computer(s), computing device(s), automation device(s), virtual machine(s), etc., can cause the machine(s) to perform the operations described.

System 202 includes memory 220 for storing computer-executable components and one or more processors 218 operably coupled via one or more communication busses 224 to memory 220 for executing the computer-executable components stored in memory 220. As shown in FIG. 2, the computer-executable components include a defect generation component 204, a doping component 206, a stabilization layer bonding component 208, a smart cut component 210, and a polishing component 212. In various embodiments, one or more of the defect generation component 204, doping component 206, stabilization layer bonding component 208, smart cut component 210, polishing component 212, the one or more processors 218, and memory 220 can be electrically and/or communicatively coupled to one another to perform one or more of the functions of the semiconductor device manufacturing system 202. In some embodiments, components 204, 206, 208, 210, and 212 can comprise software instructions stored on memory 220 and executed by processor(s) 218 to facilitate control of corresponding semiconductor device manufacturing machinery or equipment. Also, in some embodiments, any of components 204, 206, 208, 210, and 212 can comprise the associated machinery or hardware for performing the manufacturing functions associated with the respective components.

Defect generation component 204 can prepares a silicon wafer for a smart cut process by generating a defect region at a defined depth below a top surface of the wafer (e.g., using hydrogen implantation or another defect generation technique). Doping component 206 can apply an ultra-high doping process to a portion of the silicon wafer to form first and second superconducting electrodes. Stabilization layer bonding component 208 can bond a stabilizing wafer to the silicon wafer. Smart cut component 210 can split the wafer along the plane of the defect region generated by the defect generation component 204. Polishing component 212 can polish the surface of the silicon wafer exposed by the smart cut process to obtain a target wafer thickness.

As noted above, the monolithic silicon Josephson junction design described herein, as well as the example process for fabricating the Josephson junction, are predicated on the observation that silicon that has been highly doped with a suitable doping material, such as boron, becomes a superconductor at sufficiently low temperatures, while silicon that has not been doped in this manner remains insulative at those temperatures. Accordingly, embodiments of the manufacturing process described herein can fabricate a Josephson junction from a single active silicon wafer using a combination of semiconductor technologies, such as gas immersion laser doping (GILD) to dope the portions of the silicon that will serve as electrodes for the junction and smart cut technology to achieve appropriate silicon thickness. Since the electrodes and the tunnel barrier are both formed from silicon, there is no need for a metallization process as part of the fabrication sequence, and so the junction can be fabricated using only semiconductor technologies without the need for a metallization process. The single-crystal structure of the resulting Josephson junction can also experience less TLS noise relative to designs that use amorphous oxide tunnel barriers.

Figure 3:
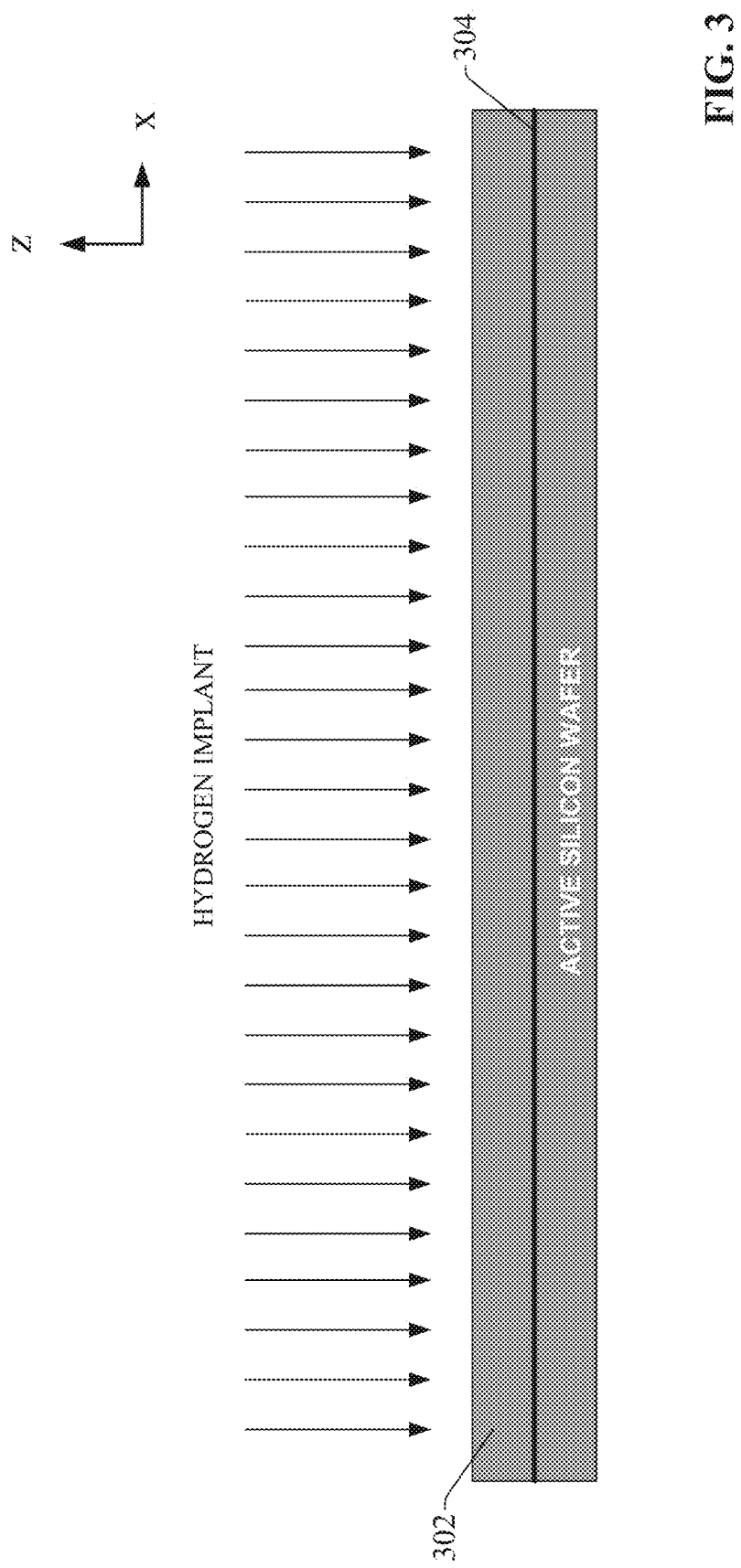
FIG. 3 is a cross-sectional view of an active silicon wafer to be processed by a semiconductor device manufacturing system to yield a monolithic silicon Josephson junction.

An example fabrication process for manufacturing a monolithic silicon Josephson junction is now described. FIG. 3 is a cross-sectional view of an active silicon wafer 302 to be processed by manufacturing system 202 to yield a monolithic silicon Josephson junction. According to an initial step of the fabrication process, the manufacturing system 202 (e.g., the defect generation component 204 of the system 202) prepares the silicon wafer 302 for a forthcoming smart cut process by generating a defect region 304 at a defined depth below a top surface of the wafer 302. In some embodiments, the defect region 304 can be formed using ion implantation of a light element such as hydrogen, which produces microcavities in the wafer's silicon lattice at a precisely defined depth below the top surface of the wafer 302. Defect generation component 204 can control the depth of the defect region 304 with a high degree of precision by adjusting the implantation energy used to implant the hydrogen. Thickness uniformity can be controlled by fine tuning the implanted species over the surface of the wafer 302. Subsequent cutting of the wafer 302 along the defect region 304—to be performed latter in the process—can be performed by applying a shearing stress, by applying heat energy, or by another cutting means.

Figure 4:
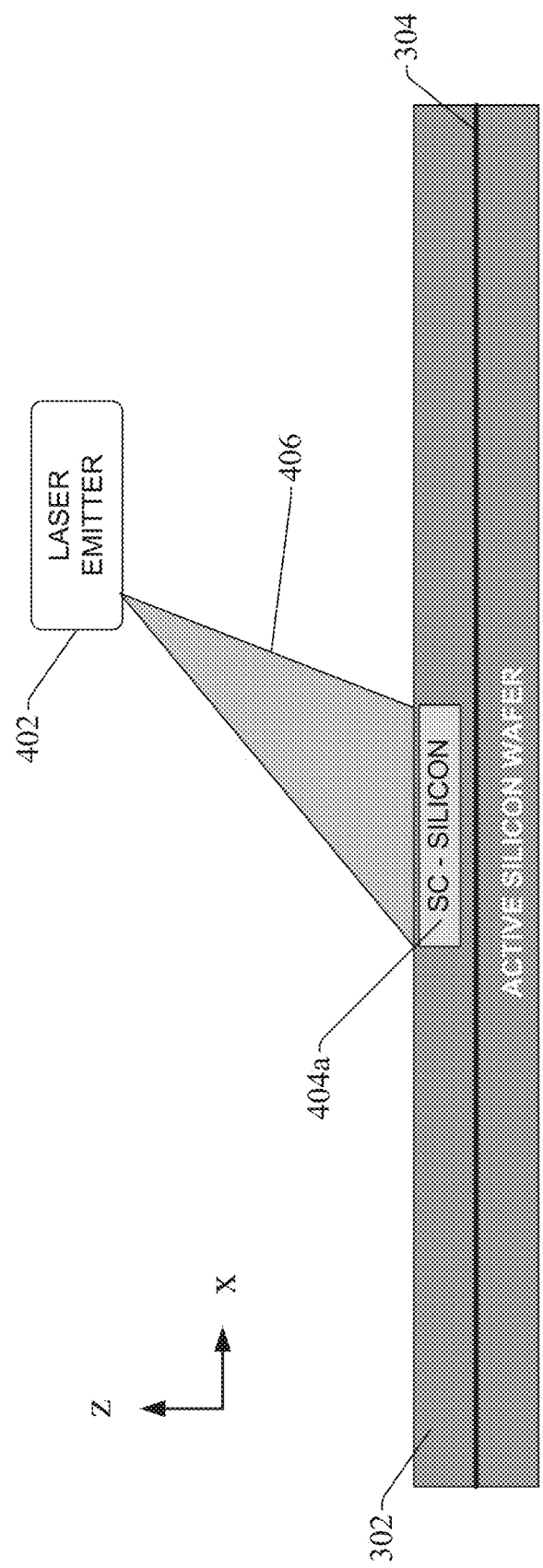
FIG. 4 is a cross-sectional view of an active silicon wafer as a laser shot is applied to dope a first side of the silicon wafer.

Next, doping of the first superconducting electrode can be performed using GILD doping. FIG. 4 is a cross-sectional view of the active silicon wafer 302 as a laser shot is applied to dope a first side of the silicon wafer 302. In this step, the manufacturing system 202 (e.g., the doping component 206 of the system 202) performs ultra-high doping of a portion of one side of the silicon wafer 302 to form the first superconducting electrode 404a of the Josephson junction. In this example, the system 202 applies the heat necessary to perform the GILD doping by emitting a pulsed laser 406 on the portion of the wafer 302 to be doped.

In the present example it is assumed that the superconducting portions of the silicon wafer 302 are doped with boron. However, other doping materials capable of transforming silicon to a superconducting material may also be used (e.g., phosphorus or another suitable doping material). In an example GILD doping process, the silicon wafer 302 can be placed in a containment chamber and emersed in boron gas. The pulsed laser 406 is then directed at the region of the silicon wafer 302 to be doped (the region to be formed into first superconducting electrode 404a). This results in a localized melting and subsequent recrystallization of the silicon wafer material, allowing boron atoms in the gas to diffuse into the molten sections of the silicon wafer 302. As a result of this process, the silicon region that was heated by the laser 406 is infused with boron impurities, yielding a p-type semiconductor and rendering the heated region superconducting under suitable conditions (e.g., at sufficiently low temperatures).

GILD doping is a suitable technology for producing the superconducting electrodes 404 since this technology allows the junction depth and dopant concentration to be precisely controlled and yields a box-like profile for the doped region, allowing ultra-precise structures to be formed in the x, y, and z directions. Experimentally, a maximum superconducting critical temperature $T_c$ of 0.6 Kelvin was observed for silicon doped with boron at a density of approximately 8 atomic %.

The degree of control afforded by GILD doping also allows the depth of the doped regions, as well as the tunnel barrier of the junction (which will be defined in part by the depth of the doped regions, as will be discussed below) to be precisely controlled. The dopant depth, and thus the depth of the superconducting electrode 404, can be controlled by the number of GILD laser shots applied to the doped region, with greater depths achieved using a greater number of laser shots. The roughness of laser-treated silicon is observed to be below 0.5 nanometers (nm).

Figure 5:
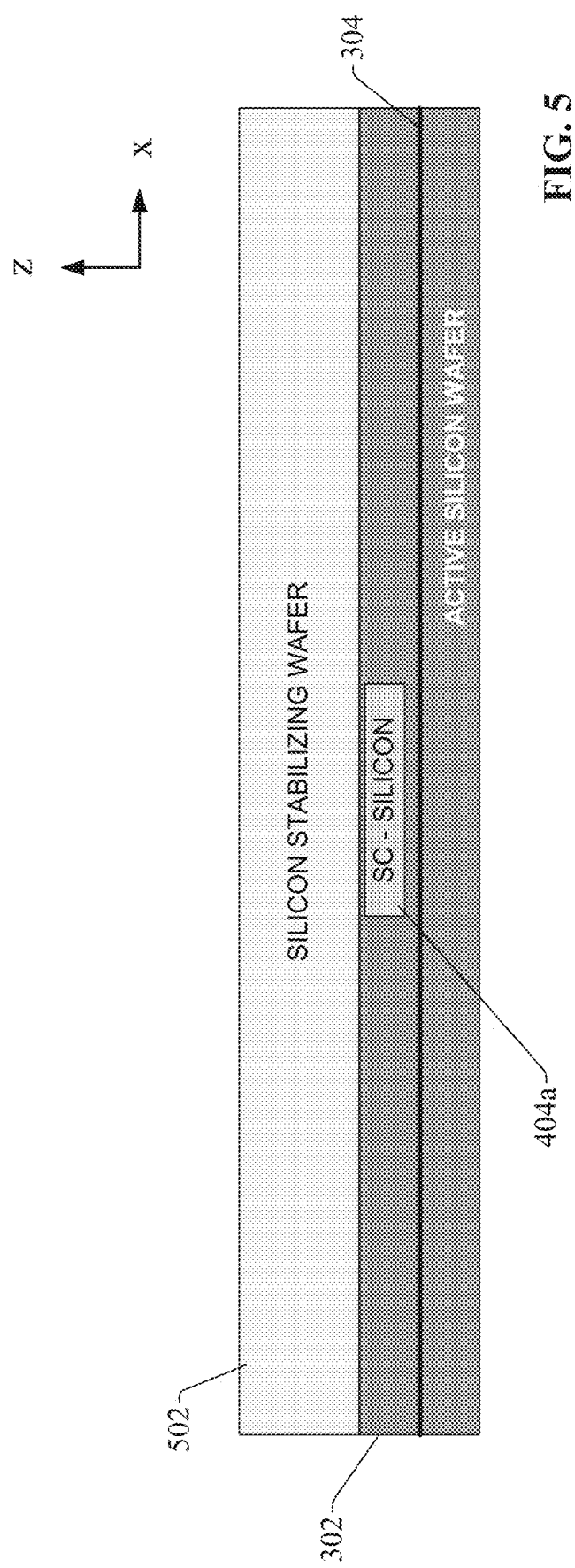
FIG. 5 is a cross-sectional view of an active silicon wafer a stabilizing wafer has been bonded to the wafer.

Next, a stabilizing substrate is bonded to the wafer 302. FIG. 5 is a cross-sectional view of the active silicon wafer 302 after the system 202 (e.g., the stabilizing layer bonding component 208 of the system 202) has bonded a stabilizing wafer 502 to the silicon wafer 302. The stabilizing wafer 502 (which may also be a silicon wafer or may comprise another material) is cleaned and bonded to the side of the silicon wafer 302 that was subjected to the first GILD process. The stabilizing wafer 502 can serve to stabilize the structure as a whole during the subsequent smart cut process. The manufacturing system 202 can use any suitable technique for bonding the stabilizing wafer 502 to the silicon wafer 302 (e.g., by using Van der Waals' forces, or another suitable bonding technique).

Figure 6:
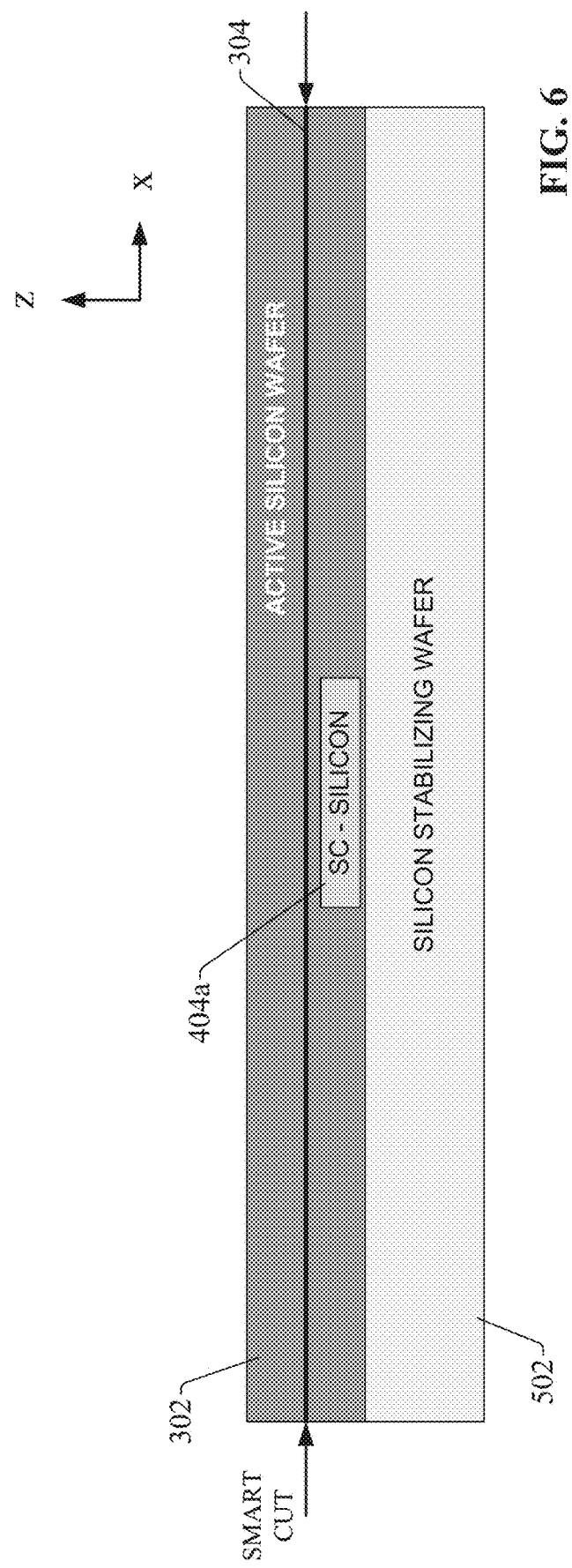
FIG. 6 is a cross-sectional view of a structure comprising an active silicon wafer bonded with a stabilizing wafer after the assembly has been rotated in preparation for a smart cut process.
Figure 7:
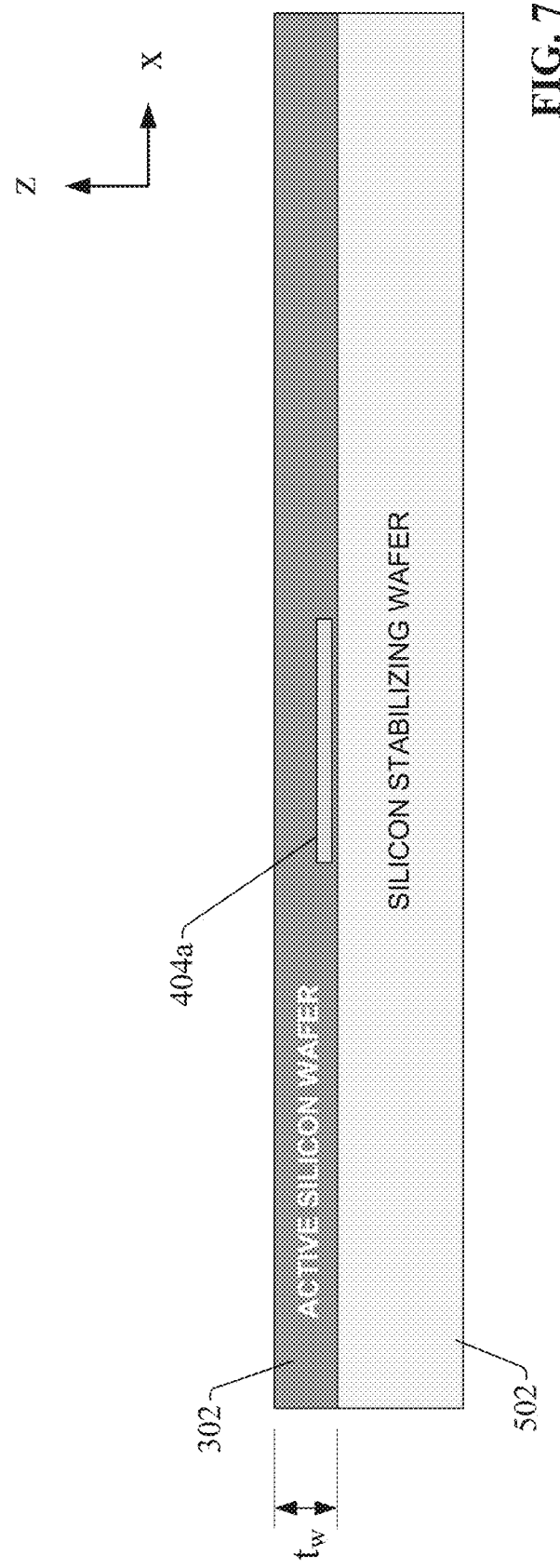
FIG. 7 is a cross-sectional view of a structure comprising a silicon wafer bonded with a stabilizing wafer after a smart cut has been applied.

The resulting structure comprising the silicon wafer 302 bonded with the stabilizing wafer 502 is then rotated, as shown in FIG. 6, so that the wafer 302 can be subjected to the smart cut process. The manufacturing system 202 (e.g., the smart cut component 210 of the system 202) can split the wafer 302 along the x-y direction along the plane of the hydrogen-implanted defect region 304. The system 202 can use any suitable cutting technique to shear the wafer 302, including but not limited to application of shearing stress to the wafer 302 or by heating the wafer 302 (e.g., to a temperature of 400° C. or greater).

Figure 8:
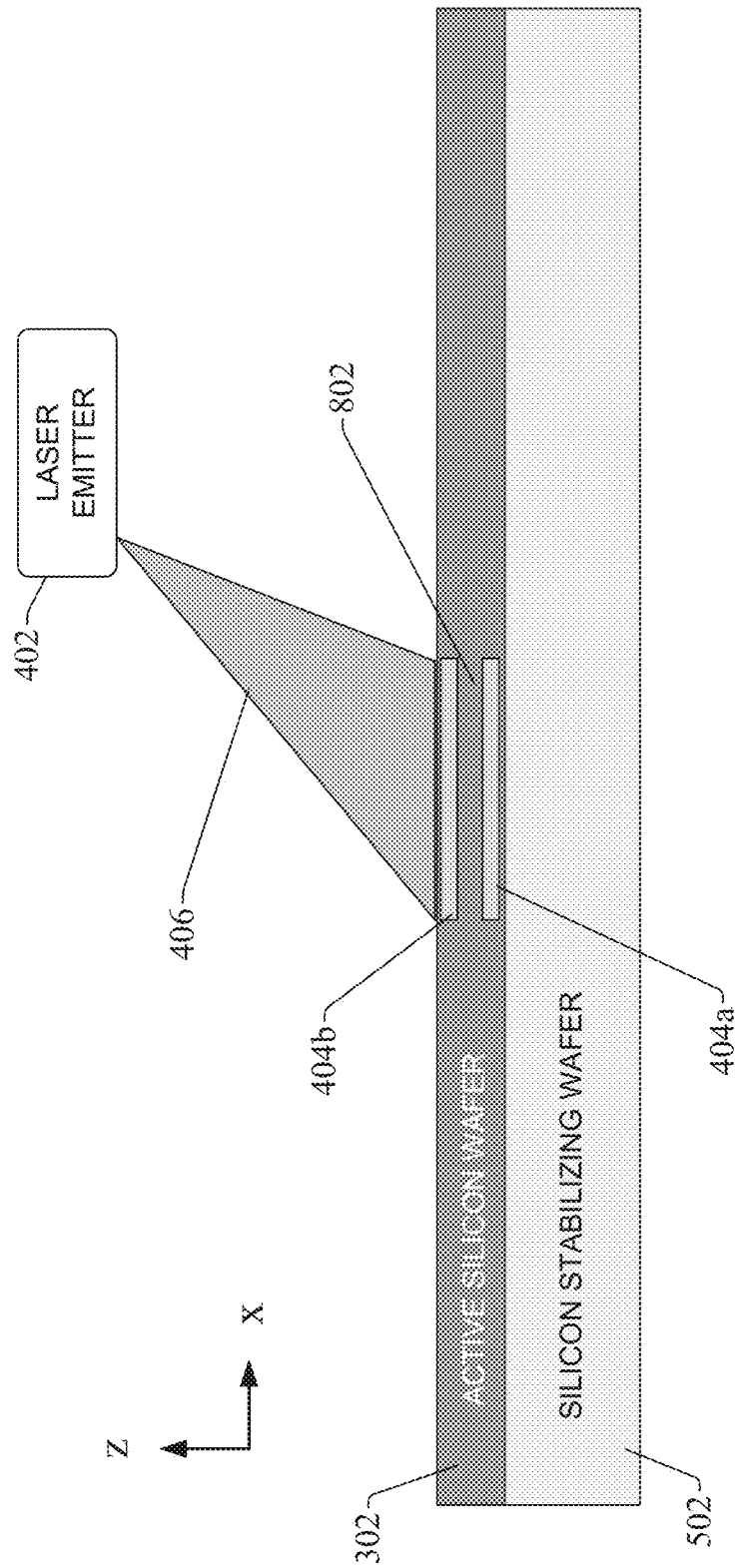
FIG. 8 is a cross-sectional view of the structure comprising a silicon wafer bonded with a stabilizing wafer as a second laser shot is applied.

FIG. 8 is a cross-sectional view of the structure comprising the silicon wafer 302 bonded with the stabilizing wafer 502 after the smart cut has been applied. At this stage, the manufacturing system 202 (e.g., the polishing component 212 of system 202) can polish the surface of the silicon wafer 302 to obtain a target wafer thickness $t_w$. Any suitable polishing technique can be used, including but not limited to chemical mechanical polishing.

Smart cut technology can achieve a wafer thickness $t_w$ as low as a minimum of approximately 20 nm with a precision of approximately ±0.5 nm. This minimum thickness is within the GILD doping range, allowing for two-sided GILD doping of the wafer 302 after smart cutting. After the target thickness $t_w$ has been achieved via the smart cut and polishing steps, a second GILD doping process can be applied to the opposite side of the wafer 302 to yield the second electrode. FIG. 8 is a cross-sectional view of the structure comprising the silicon wafer 302 bonded with the stabilizing wafer 502 as a second laser shot is applied. Using a similar GILD doping process used to dope the first electrode 404a (as described above in connection with FIG. 4), laser emitter 402 emits another pulsed laser 406 on the surface of the wafer 302 opposite the surface on which the first electrode 404a was formed, producing a second superconducting electrode 404b comprising a highly doped silicon region of the wafer 302.

The non-doped silicon region 802 between the two superconducting electrodes 404a and 404b (that is, between the highly doped silicon regions) serves as the tunnel barrier for the resulting Josephson junction. Thus, relative to the example Josephson junction illustrated in FIG. 1, the metal superconductor layers 106a and 106b have been replaced with the highly doped silicon superconducting regions—electrodes 404a and 104b—and the oxide tunnel barrier 108 has been replaced with the non-doped silicon region 802, yielding a Josephson junction formed from a monolithic silicon wafer 302 without the need for a metallization process or epitaxial growth technology. The thickness of the tunnel barrier (non-doped silicon) region 802 (analogous to thickness d of the oxide tunnel barrier depicted in FIG. 1) can be controlled during manufacture by appropriate selections of wafer thickness $t_w$ and depth of boron doping of the superconducting electrodes 404a and 404b. In this way, Josephson junctions can be manufactured with different resonant frequencies if required by defining the thickness $t_w$ of the tunnel barrier region 802 (the insulation gap layer thickness) accordingly.

In some embodiments, the electronic properties of the tunnel barrier region 802 can be further tuned by adding dopants to the region 802 or using an electrostatic gate (which can be fabricated using a similar process). Other device parameters of the Josephson can be tuned by profiling the wafer 302 using secondary ion mass spectroscopy, Rutherford backscattering, transmission electron microscopy, or other such technologies. In addition, the electronic properties of the junction can be controlled by measuring the room temperature resistivity that correlates well to the low temperature electronic properties via the Ambegaokar-Baratoff relation.

Feasibility of the Josephson junction design described herein can be verified mathematically. Superconducting qubits can be defined by their energy scales. The charging energy $E_c$ and Josephson energy $E_J$ are given by $$E_c = \frac{(2e)^2}{2C_J} \tag{1}$$

$$E_J = \frac{\hbar I_c}{2e} \tag{2}$$

where e is electron charge, $C_J$ is the junction capacitance, $\hbar$ is Planck's constant, and $I_c$ is the junction critical current. This yields a frequency of $$2\pi f h = \sqrt{8 E_J E_c} - E_c \tag{3}$$

where f is qubit frequency.

In the transmon regime:

$$E_J/E_c \approx 50 \tag{4}$$

and $$f \approx 5 \tag{5}$$

which yields $$2\pi f h \approx 19 E_c \tag{6}$$

$$E_c \approx 1.65 \text{ GHz } E_c \approx \frac{(2e)^2}{2C_J} \tag{7}$$

and $$C_J \approx 47 fF \approx \varepsilon_r \varepsilon_0 A/d \tag{8}$$

The ratio of area A to thickness d (in nm) can be given by $$A/d \approx 4.6e-4 \tag{9}$$

or $$A/d \approx 4.6e5 \tag{10}$$

For example, if thickness d is 5 nm, then area A can be approximately 300×300 nm². If Josephson energy $E_1$ is $$E_J \approx 50 E_c = 82.5 \text{ GHz} \tag{11}$$

then the critical current $I_c$ is $$I_c \approx 4.2 \text{ nA} \tag{12}$$

A critical temperature $T_c$ of 0.6 K corresponds to a superconducting gap $\Delta(0)$ of $$\Delta(0) = 1.76 k_B T_C = 91 \text{ µeV} \tag{13}$$

Since critical current $I_c$ can be given by $$I_C = \frac{\pi \Delta(0)}{2 e R_n} \tag{14}$$

a reasonable tunnel junction resistance of approximately 35 kΩ is obtained.

By combining GILD doping and smart cut technology to fabricate Josephson junctions from a monolithic single-crystal silicon wafer, embodiments of the Josephson junction design and corresponding manufacturing process described herein allow Josephson junctions to be fabricated using a simpler manufacturing technique—without the need for metallization or epitaxial growth technology—relative to designs that use metal superconducting layers and amorphous tunnel barriers. The single-crystal structure of the resulting Josephson junction can yield low TLS noise. Electronic properties of the Josephson junction can be tuned by controlling the thickness of the tunnel junction, which can be controlled by appropriate selection of wafer thickness (achieved using smart cut technology) and doping depth of the superconducting regions (achieved by the GILD doping steps). Moreover, the manufacturing process offers multiple additional degrees of freedom for junction grid designs along the additional z-axis.

Figure 9:
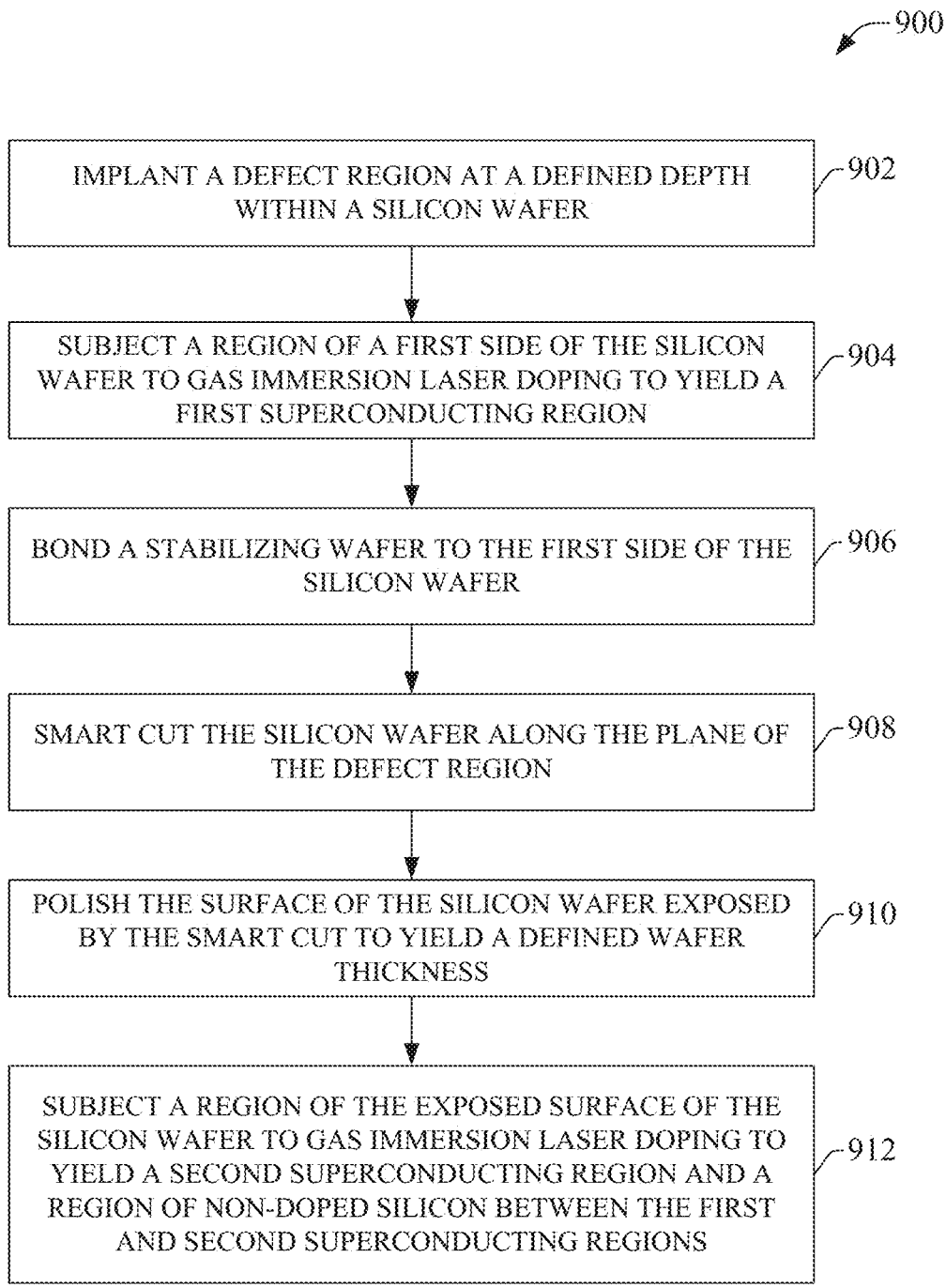
FIG. 9 illustrates a flow diagram of an example, non-limiting computer-implemented method for fabricating a monolithic silicon Josephson junction from a wafer of silicon.

FIG. 9 illustrates a methodology in accordance with one or more embodiments of the subject application. While, for purposes of simplicity of explanation, the methodology shown herein are shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

FIG. 9 illustrates an example methodology 900 for fabricating a monolithic silicon Josephson junction from a wafer of silicon. Initially, at 902, a defect region can be implanted at a defined depth within a silicon wafer on which a Josephson junction is to be formed (e.g., by defect generation component 204). In some embodiments, the defect region can be created by implanting a light element, such as hydrogen, at the defined depth below the surface of the silicon wafer (e.g., using ion implantation), yielding a layer of microcavities in the wafer's silicon lattice. The resulting defect region defines the depth of a subsequent smart cut process that will be applied at a later step of the methodology 900.

At 904, a region of a first side of the silicon wafer can be subjected to gas immersion laser doping (GILD) to yield a first superconducting region of the wafer. In some embodiments, the region can be highly doped with boron using the GILD process, whereby the silicon wafer is immersed in boron gas and the region to be doped is heated with a pulsed laser, causing boron atoms in the gas to diffuse into the molten sections of the silicon wafer. The depth of the doped region can be controlled based on the number of laser pulses directed to the region.

At 906, a stabilizing wafer can be bonded to the first side of the silicon wafer (e.g., by stabilizing layer bonding component 208). In some embodiments, Van der Waals' forces can be used to bond the stabilizing wafer to the silicon wafer. However, any suitable technique for the stabilizing wafer is within the scope of one or more embodiments.

At 908, the silicon wafer can be cut along the plane of the defect region implanted at step 902 using smart cut technology (e.g., by smart cut component 210). At 910, the surface of the silicon wafer exposed by the smart cut can be polished to yield a defined wafer thickness (e.g., by polishing component 212). Any suitable polishing technique can be used, including but not limited to chemical mechanical polishing.

At 912, a region of the surface of the silicon wafer that was exposed by the smart cut of step 908—the surface opposite that which was subjected to the first GILD doping at step 904—can be subjected to another GILD doping to yield a second superconducting region (e.g., by doping component 206). The depths of the first and second superconducting regions are such that an insulating region of non-doped silicon remains layered between the first and second superconducting regions. This insulating region serves as the tunnel barrier for the Josephson junction, with the first and second superconducting regions serving as the electrodes for the junctions.

Figure 10:
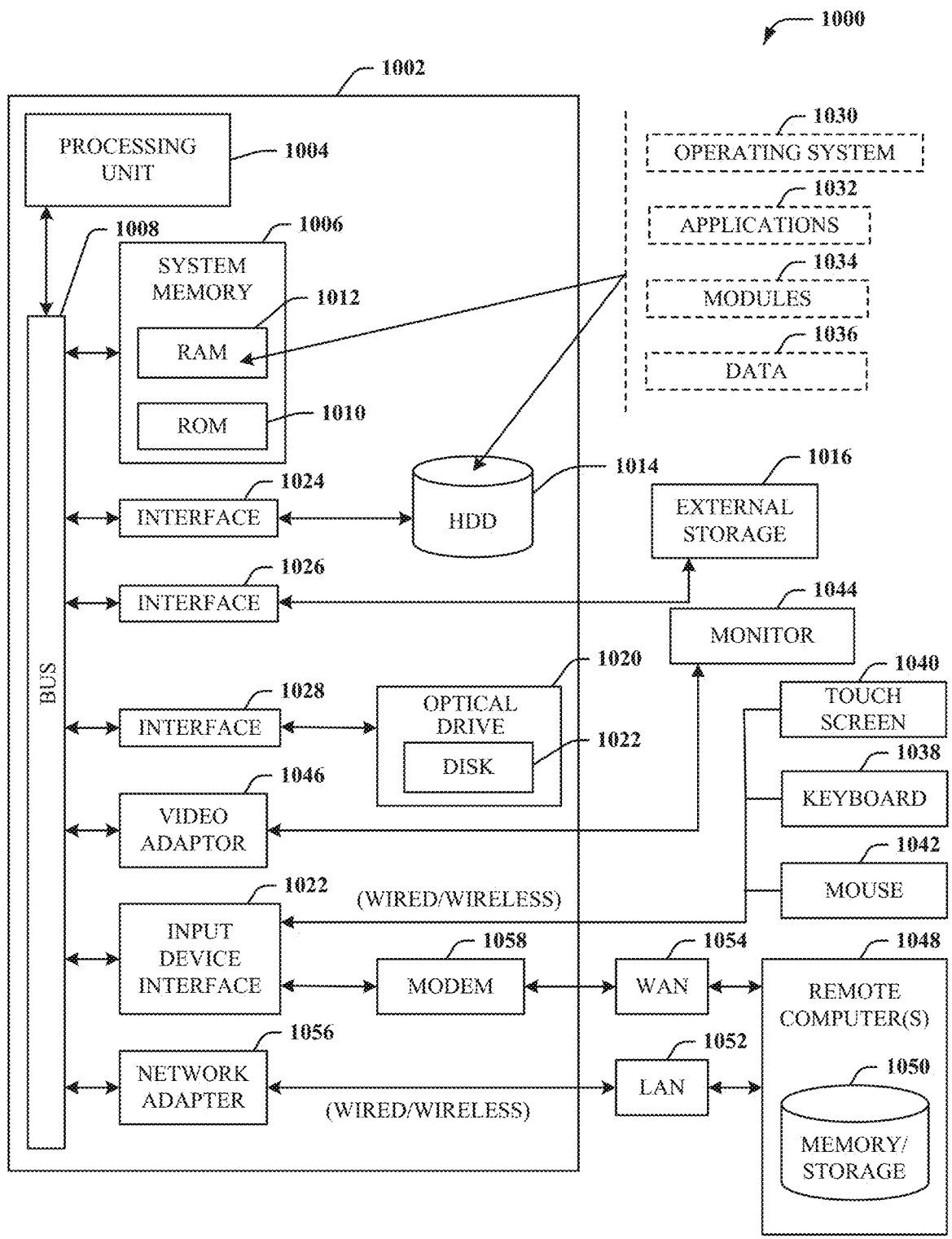
FIG. 10 illustrates a block diagram of an example, non-limiting operating environment in which one or more embodiments described herein can be facilitated.

In order to provide a context for the various aspects of the disclosed subject matter, FIG. 10 as well as the following discussion is intended to provide a brief, general description of a suitable environment in which the various aspects of the disclosed subject matter may be implemented. While the embodiments have been described above in the general context of computer-executable instructions that can run on one or more computers, those skilled in the art will recognize that the embodiments can be also implemented in combination with other program modules and/or as a combination of hardware and software.

With reference to FIG. 10, the example environment 1000 for implementing various embodiments of the aspects described herein includes a computer 1002, the computer 1002 including a processing unit 1004, a system memory 1006 and a system bus 1008. The system bus 1008 couples system components including, but not limited to, the system memory 1006 to the processing unit 1004. The processing unit 1004 can be any of various commercially available processors. Dual microprocessors and other multi-processor architectures can also be employed as the processing unit 1004.

The system bus 1008 can be any of several types of bus structure that can further interconnect to a memory bus (with or without a memory controller), a peripheral bus, and a local bus using any of a variety of commercially available bus architectures. The system memory 1006 includes ROM 1010 and RAM 1012. A basic input/output system (BIOS) can be stored in a non-volatile memory such as ROM, erasable programmable read only memory (EPROM), EEPROM, which BIOS contains the basic routines that help to transfer information between elements within the computer 1002, such as during startup. The RAM 1012 can also include a high-speed RAM such as static RAM for caching data.

The computer 1002 further includes an internal hard disk drive (HDD) 1014 (e.g., EIDE, SATA), one or more external storage devices 1016 (e.g., a magnetic floppy disk drive (FDD) 1016, a memory stick or flash drive reader, a memory card reader, etc.) and an optical disk drive 1020 (e.g., which can read or write from a CD-ROM disc, a DVD, a BD, etc.). While the internal HDD 1014 is illustrated as located within the computer 1002, the internal HDD 1014 can also be configured for external use in a suitable chassis (not shown). Additionally, while not shown in environment 1000, a solid state drive (SSD) could be used in addition to, or in place of, an HDD 1014. The HDD 1014, external storage device(s) 1016 and optical disk drive 1020 can be connected to the system bus 1008 by an HDD interface 1024, an external storage interface 1026 and an optical drive interface 1028, respectively. The interface 1024 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 1002, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1012, including an operating system 1030, one or more application programs 1032, other program modules 1034 and program data 1036. All or portions of the operating system, applications, modules, and/or data can also be cached in the RAM 1012. The systems and methods described herein can be implemented utilizing various commercially available operating systems or combinations of operating systems.

Computer 1002 can optionally comprise emulation technologies. For example, a hypervisor (not shown) or other intermediary can emulate a hardware environment for operating system 1030, and the emulated hardware can optionally be different from the hardware illustrated in FIG. 10. In such an embodiment, operating system 1030 can comprise one virtual machine (VM) of multiple VMs hosted at computer 1002. Furthermore, operating system 1030 can provide runtime environments, such as the Java runtime environment or the .NET framework, for application programs 1032. Runtime environments are consistent execution environments that allow application programs 1032 to run on any operating system that includes the runtime environment. Similarly, operating system 1030 can support containers, and application programs 1032 can be in the form of containers, which are lightweight, standalone, executable packages of software that include, e.g., code, runtime, system tools, system libraries and settings for an application.

Further, computer 1002 can be enable with a security module, such as a trusted processing module (TPM). For instance with a TPM, boot components hash next in time boot components, and wait for a match of results to secured values, before loading a next boot component. This process can take place at any layer in the code execution stack of computer 1002, e.g., applied at the application execution level or at the operating system (OS) kernel level, thereby enabling security at any level of code execution.

A user can enter commands and information into the computer 1002 through one or more wired/wireless input devices, e.g., a keyboard 1038, a touch screen 1040, and a pointing device, such as a mouse 1042. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1004 through an input device interface 1022 that can be coupled to the system bus 1008, but can be connected by other interfaces, such as a parallel port, an IEEE 1394 serial port, a game port, a USB port, an IR interface, a BLUETOOTH® interface, etc.

A monitor 1044 or other type of display device can be also connected to the system bus 1008 via an interface, such as a video adapter 1046. In addition to the monitor 1044, a computer typically includes other peripheral output devices (not shown), such as speakers, printers, etc.

The computer 1002 can operate in a networked environment using logical connections via wired and/or wireless communications to one or more remote computers, such as a remote computer(s) 1048. The remote computer(s) 1048 can be a workstation, a server computer, a router, a personal computer, portable computer, microprocessor-based entertainment appliance, a peer device or other common network node, and typically includes many or all of the elements described relative to the computer 1002, although, for purposes of brevity, only a memory/storage device 1050 is illustrated. The logical connections depicted include wired/wireless connectivity to a local area network (LAN) 1052 and/or larger networks, e.g., a wide area network (WAN) 1054. Such LAN and WAN networking environments are commonplace in offices and companies, and facilitate enterprise-wide computer networks, such as intranets, all of which can connect to a global communications network, e.g., the Internet.

When used in a LAN networking environment, the computer 1002 can be connected to the local network 1052 through a wired and/or wireless communication network interface or adapter 1056. The adapter 1056 can facilitate wired or wireless communication to the LAN 1052, which can also include a wireless access point (AP) disposed thereon for communicating with the adapter 1056 in a wireless mode.

When used in a WAN networking environment, the computer 1002 can include a modem 1058 or can be connected to a communications server on the WAN 1054 via other means for establishing communications over the WAN 1054, such as by way of the Internet. The modem 1058, which can be internal or external and a wired or wireless device, can be connected to the system bus 1008 via the input device interface 1022. In a networked environment, program modules depicted relative to the computer 1002 or portions thereof, can be stored in the remote memory/storage device 1050. It will be appreciated that the network connections shown are example and other means of establishing a communications link between the computers can be used.

When used in either a LAN or WAN networking environment, the computer 1002 can access cloud storage systems or other network-based storage systems in addition to, or in place of, external storage devices 1016 as described above. Generally, a connection between the computer 1002 and a cloud storage system can be established over a LAN 1052 or WAN 1054 e.g., by the adapter 1056 or modem 1058, respectively. Upon connecting the computer 1002 to an associated cloud storage system, the external storage interface 1026 can, with the aid of the adapter 1056 and/or modem 1058, manage storage provided by the cloud storage system as it would other types of external storage. For instance, the external storage interface 1026 can be configured to provide access to cloud storage sources as if those sources were physically connected to the computer 1002.

The computer 1002 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

Figure 11:
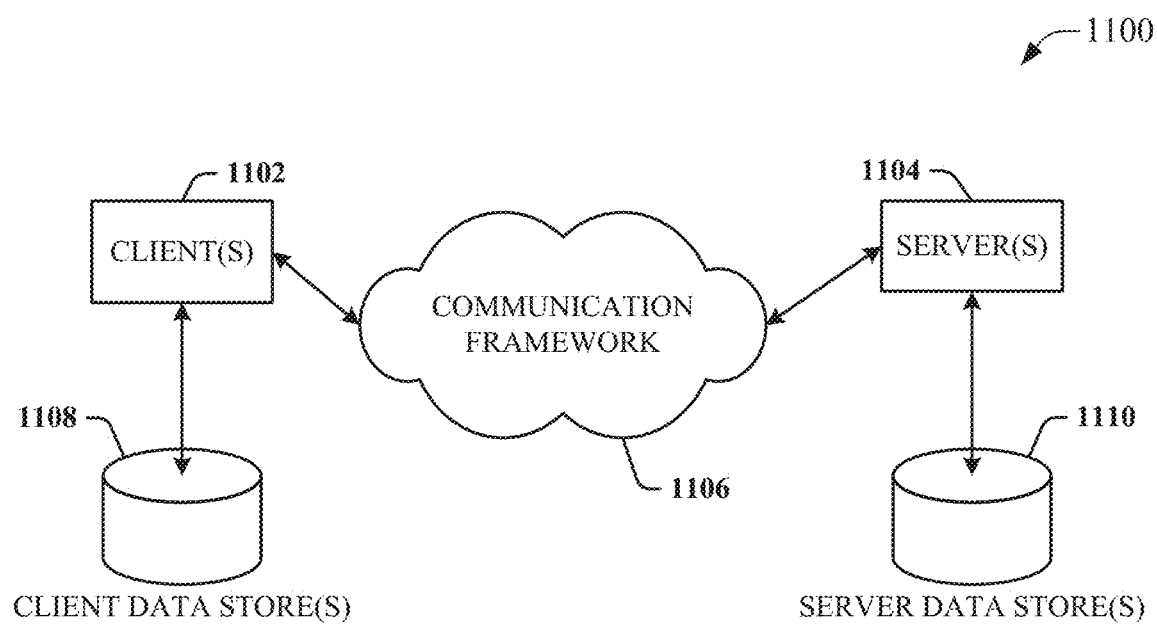
FIG. 11 illustrates an example networking environment.

FIG. 11 is a schematic block diagram of a sample computing environment 1100 with which the disclosed subject matter can interact. The sample computing environment 1100 includes one or more client(s) 1102. The client(s) 1102 can be hardware and/or software (e.g., threads, processes, computing devices). The sample computing environment 1100 also includes one or more server(s) 1104. The server(s) 1104 can also be hardware and/or software (e.g., threads, processes, computing devices). The servers 1104 can house threads to perform transformations by employing one or more embodiments as described herein, for example. One possible communication between a client 1102 and servers 1104 can be in the form of a data packet adapted to be transmitted between two or more computer processes. The sample computing environment 1100 includes a communication framework 1106 that can be employed to facilitate communications between the client(s) 1102 and the server(s) 1104. The client(s) 1102 are operably connected to one or more client data store(s) 1108 that can be employed to store information local to the client(s) 1102. Similarly, the server(s) 1104 are operably connected to one or more server data store(s) 1110 that can be employed to store information local to the servers 1104.

What has been described above includes examples of the subject innovation. It is, of course, not possible to describe every conceivable combination of components or methodologies for purposes of describing the disclosed subject matter, but one of ordinary skill in the art may recognize that many further combinations and permutations of the subject innovation are possible. Accordingly, the disclosed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system as well as a computer-readable medium having computer-executable instructions for performing the acts and/or events of the various methods of the disclosed subject matter.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

In this application, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks [e.g., compact disk (CD), digital versatile disk (DVD) . . . ], smart cards, and flash memory devices (e.g., card, stick, key drive . . . ).

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., mobile phone, PDA, etc.), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," "data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
   a silicon wafer comprising:
      a first doped region formed on a first side of the silicon wafer, wherein the first doped region is superconducting;
      a second doped region formed on a second side of the silicon wafer opposite the first side, wherein the second doped region is superconducting; and
      a non-doped region layered between the first doped region and the second doped region, wherein the non-doped region acts as a tunnel barrier of a Josephson junction comprising the first doped region, the second doped region, and the non-doped region, wherein a thickness of the non-doped region is defined by a thickness of the silicon wafer and respective depths of the first doped region and the second doped region, and wherein the thickness of the silicon wafer is set by a smart cut process and a polishing process.

2. The device of claim 1, wherein the first doped region and the second doped region comprise silicon doped with boron.

3. The device of claim 1, wherein the first doped region and the second doped region are formed using Gas Immersion Laser Doping (GILD).

4. The device of claim 1, further comprising a defect region implanted into the silicon wafer to facilitate the smart cut process.

5. The device of claim 4, wherein the defect region comprises hydrogen at a defined depth below a surface of the silicon wafer.

6. A system, comprising:
   a processor that executes computer-executable components stored in memory, wherein the computer-executable components comprise:
      a doping component that dopes a first region of a first side of a silicon wafer to yield a first superconducting region; and a smart cut component that performs a smart cut operation on the silicon wafer along a plane of a defect region, wherein the doping component further dopes a second region of a second side of the silicon wafer exposed by the smart cut operation to yield a second superconducting region separated from the first superconducting region by a non-doped region of the silicon wafer.

7. The system of claim 6, wherein the first superconducting region, the second superconducting region, and the non-doped region of the silicon wafer form a Josephson junction, wherein the first superconducting region and the second superconducting region act as first and second electrodes, respectively, for the Josephson junction, and wherein the non-doped region of the silicon wafer acts as a tunnel barrier for the Josephson junction.

8. The system of claim 6, wherein the doping component dopes the first region and the second region with boron.

9. The system of claim 6, wherein the doping component dopes the first region and the second region using Gas Immersion Laser Doping (GILD).

10. The system of claim 6, further comprising a defect generation component that implants the defect region into the silicon wafer to facilitate the smart cut operation.

11. The system of claim 10, wherein the defect generation component implants hydrogen at a defined depth below a surface of the silicon wafer to yield the defect region.

12. The system of claim 6, further comprising a polishing component that polishes the second side of the silicon wafer exposed by the smart cut operation prior to doping of the second region.

13. The system of claim 12, wherein the polishing component applies chemical mechanical polishing to the second side of the silicon wafer to yield a target thickness for the silicon wafer.

14. The system of claim 13, wherein the target thickness is set as a function of a target thickness for the non-doped region of the silicon wafer.

15. A computer-implemented method, comprising:
doping, by a system operatively coupled to a processor, a first region of a first side of a silicon wafer to yield a first superconducting region;
performing, by the system, a smart cut operation on the silicon wafer along a plane of a defect region; and
doping, by the system, a second region of a second side of the silicon wafer exposed by the smart cut operation to yield a second superconducting region separated from the first superconducting region by a non-doped region of the silicon wafer.

16. The computer-implemented method of claim 15, wherein the doping of the first region and the doping of the second region comprises doping the first region and the second region with boron.

17. The computer-implemented method of claim 15, wherein the doping of the first region and the doping of the second region comprises doping the first region and the second region by gas immersion laser doping.

18. The computer-implemented method of claim 15, wherein the performing of the smart cut operation comprises implanting the defect region into the silicon wafer and shearing the silicon wafer along the plane of the defect region.

19. The computer-implemented method of claim 18, wherein the implanting comprises implanting hydrogen at a defined depth below a surface of the silicon wafer to yield the defect region.

20. The computer-implemented method of claim 15, further comprising polishing, by the system, the second side of the silicon wafer exposed by the smart cut operation prior to doping of the second region.

* * * * *